US010255399B2

(12) United States Patent
Srinivasan et al.

(10) Patent No.: US 10,255,399 B2
(45) Date of Patent: Apr. 9, 2019

(54) METHOD, APPARATUS AND SYSTEM FOR AUTOMATICALLY PERFORMING END-TO-END CHANNEL MAPPING FOR AN INTERCONNECT

(71) Applicant: Intel Corporation, Santa Clara, CA (US)

(72) Inventors: Krishnan Srinivasan, San Jose, CA (US); Robert P. Adler, Santa Clara, CA (US); Eric A. Geisler, Hillsboro, OR (US); Robert De Gruijl, San Francisco, CA (US); Jay Tomlinson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 15/338,639

(22) Filed: Oct. 31, 2016

(65) Prior Publication Data

US 2018/0121574 A1 May 3, 2018

(51) Int. Cl.
*G06F 17/50* (2006.01)
*G06F 13/40* (2006.01)
*G06F 13/42* (2006.01)
*H04L 29/12* (2006.01)

(52) U.S. Cl.
CPC ........ *G06F 17/505* (2013.01); *G06F 13/4068* (2013.01); *G06F 13/4282* (2013.01); *H04L 61/2007* (2013.01); *G06F 2213/0026* (2013.01)

(58) Field of Classification Search
USPC ....................................................... 716/104
See application file for complete search history.

(56) References Cited

U.S. PATENT DOCUMENTS

| 7,802,221 | B1 | 9/2010 | Brink et al. |
| 2002/0188910 | A1 | 12/2002 | Zizzo |
| 2016/0154916 | A1 | 6/2016 | Durand et al. |
| 2016/0179161 | A1 | 6/2016 | Adler et al. |
| 2016/0180001 | A1 | 6/2016 | Adler |
| 2018/0089342 | A1* | 3/2018 | Srinivasan ............ G06F 17/504 |

FOREIGN PATENT DOCUMENTS

WO      2010056700      5/2010

OTHER PUBLICATIONS

International Searching Authority, "Notification of Transmittal of the International Search Report and the Written Opinion of the International Searching Authority," dated Jan. 30, 2018, in International application No. PCT/US2017/054698.

(Continued)

*Primary Examiner* — Bryce M Aisaka
(74) *Attorney, Agent, or Firm* — Trop, Pruner & Hu, P.C.

(57) ABSTRACT

In one embodiment, a design tool for designing a system on chip (SoC) includes hardware mapping logic to automatically generate a channel mapping for a path between a first intellectual property (IP) logic of the SoC and a second IP logic of the SoC. The hardware mapping logic, based at least in part on user input of a source channel associated with the first IP logic, a sink channel associated with the second IP logic and at least one derivation parameter, is to generate the channel mapping according to one of a plurality of derivation algorithms. Other embodiments are described and claimed.

20 Claims, 9 Drawing Sheets

(56) References Cited

OTHER PUBLICATIONS

Sonics, Inc., "SonicsStudio Director, Product Brief," Nov. 2015, 2 pages.
Sonics, Inc., "SonicsLX On-Chip Network, Product Brief," Nov. 2015, 2 pages.
U.S. Appl. No. 14/880,443, filed Oct. 12, 2015, entitled "Providing Multiple Roots in a Semiconductor Device," by Michael T. Klinglesmith, et al.
U.S. Appl. No. 14/865,005, filed Sep. 25, 2015, entitled "Handling a Partition Reset in a Multi-Root System," by Michael T. Klinglesmith, et al.
U.S. Appl. No. 15/279,725, filed Sep. 29, 2016, entitled "Method, Apparatus and System for Automatically Deriving Parameters for an Interconnect," by Krishnan Srinivasan, et al.

* cited by examiner

METHOD, APPARATUS AND SYSTEM FOR AUTOMATICALLY PERFORMING END-TO-END CHANNEL MAPPING FOR AN INTERCONNECT

TECHNICAL FIELD

This disclosure pertains to computing systems, and in particular (but not exclusively) to system design tools.

BACKGROUND

Advances in semiconductor processing and logic design have permitted an increase in the amount of logic that may be present on integrated circuits. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically includes one or more semiconductor die, where the die may include any number of cores, hardware threads, logical processors, interfaces, memory, controller hubs, etc. While semiconductor devices include ever-increasing amounts of capabilities and circuitry, design techniques have not kept up. Many portions of an integrated circuit design are implemented manually by designers, which unnecessarily consumes time, resources and leads to potential errors. While some automation via design tools is available, there are limitations.

DETAILED DESCRIPTION

Figure 1:
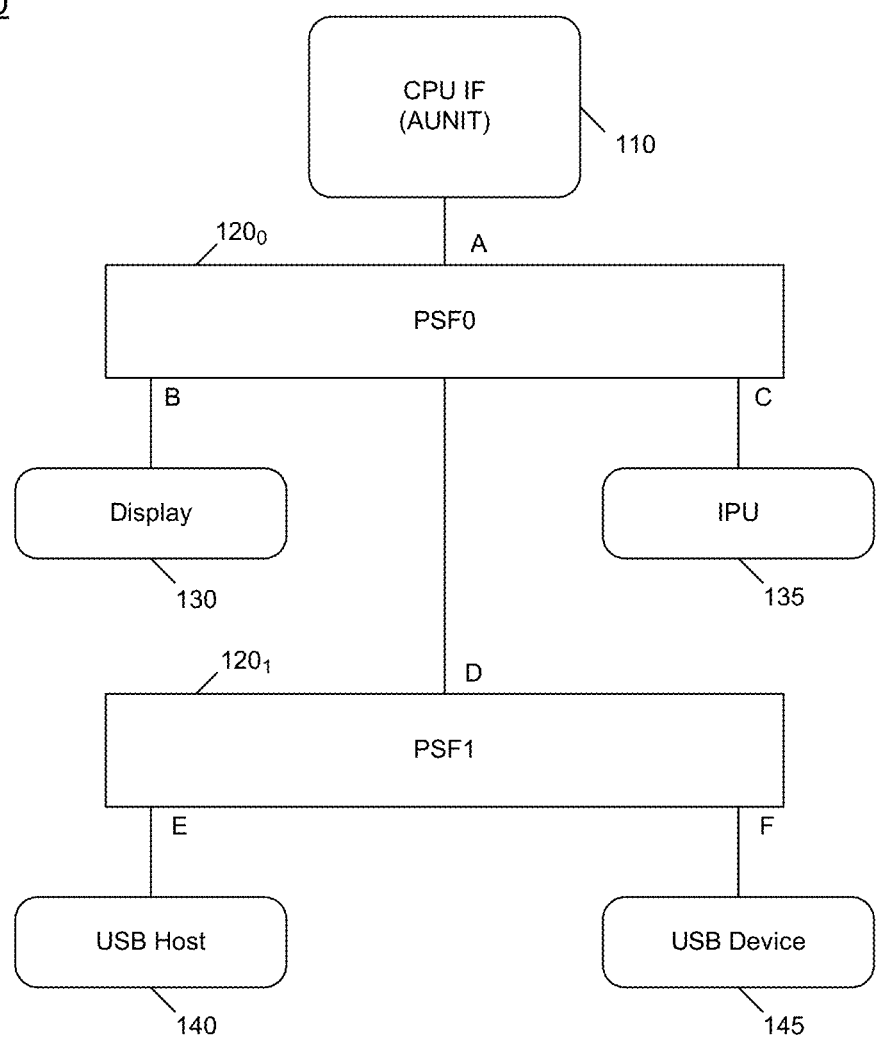
FIG. 1 is a block diagram of a SoC in accordance with an embodiment of the present invention.

In various embodiments, an integrated circuit design tool may be used to enable creation of highly automated configuration files for use in developing integrated circuits. As described herein, such design tool may be used to generate configuration files for a variety of processors, systems on chip (SoCs) and other integrated circuits (ICs). In particular embodiments described herein, these configuration files may be for interconnect structures of a SoC that leverage the design tool to easily and flexibly generate a configuration that incorporates a wide variety of potentially configurable parameters, greatly reducing burden on designers. Still further, embodiments of the design tool enable this highly automated configuration process to further allow great user flexibility to enable the user to select configuration parameters themselves for certain features or classes of features.

This automated generation of configuration files may further include automated channel mapping of routes or links between different components of the integrated circuit, in a manner that avoids the need for the user to provide significant detail as to such routing and link parameters. As will be described herein, in many embodiments channel mapping may be performed automatically by the design tool using minimal channel profile information provided by a user.

In embodiments, a representative fabric designed as described herein is an on-chip interconnect for use in platform control hubs (PCHs), processors and other SoC designs. In order to configure an interconnect such as a primary scalable fabric (PSF), an average of 5,000 parameters and a worst case of 50,000 parameters have to properly configured on each PSF instance in a topology. Many device topologies include a minimum of 3 PSF instantiations, also referred to herein as fabric segments. Without an embodiment, these parameters are set manually and propagated across PSF instances manually. Setting parameters manually is not only tedious and time consuming, but also error prone. Some errors in such manual operations are debugged at simulation time, causing considerable delays in realizing a functionally working fabric.

In various embodiments, a user can represent a configuration of a PSF network at an abstracted level, enabling a vast reduction in the number of inputs to configure a PSF network. Embodiments enable novice users (such as junior designers or engineers) to specify the minimal required input, while still allowing an expert user (such as a more senior designer or engineer) to specify all details of a PSF configuration. In all cases, any unspecified details are derived by automation software (DAC). Since the input requirements can be so few, and because the configured interconnect is correct by construction, embodiments enable considerable reductions in the time to configure a PSF network. For example, with an embodiment PSF configuration time can be reduced from weeks to hours and is practical for non-expert users. Also, last minute features of a design can be added or removed easily.

In embodiments, a user can specify only end-to-end communication requirements of components that couple to each other via a PSF network or other interconnect. In turn, a channel mapping component of the design tool may be configured to derive all internal links for ensuring functionally correct communication between these components coupled to the interconnect.

To understand the context in which highly automated fabric design techniques may be used, it is instructive to illustrate a representative SoC or other processor, the design of which may leverage embodiments as described herein. Referring now to FIG. 1, shown is a block diagram of a SoC in accordance with an embodiment of the present invention. In FIG. 1, SoC 100 is shown at a high level and illustrates various components that may be present on a single semiconductor die, e.g., as implemented in a given IC. As seen, SoC 100 includes a CPU interface 110. CPU interface 110, also referred to herein as an AUNIT, may provide an interface to main central processing unit (CPU) circuitry of the SoC, which may be realized by a plurality of homogeneous or heterogeneous cores. In some embodiments CPU interface 110 may be implemented as a coherent interconnect to such cores. In turn, CPU interface 110 couples to a first fabric $120_0$, which is a first instantiation or segment of a PSF. In embodiments, the PSF may be an integrated on-chip scalable fabric (IOSF), which may be designed according to a given specification provided by a semiconductor manufacturer to provide a standardized on-die interconnect protocol for attaching intellectual property (IP) blocks within a chip. More specifically as seen, CPU interface 110 couples to fabric $120_0$ via a first port A of fabric $120_0$.

As further illustrated in FIG. 1, on a downstream side, fabric $120_0$ couples to multiple independent intellectual property blocks (generically referred to herein as IP logics) 130 and 135. More specifically, a display controller 130 couples to fabric $120_0$ via another port B of fabric $120_0$, while an image processing unit (IPU) 135 couples to fabric $120_0$ via another port C of fabric $120_0$.

To provide interconnection to additional on-chip components, fabric $120_0$ further couples to another fabric $120_k$, which is another instantiation or segment of a primary scalable fabric. More specifically, fabric $120_1$ is coupled to fabric $120_0$ via a port D of fabric $120_1$. In turn, multiple additional IP blocks, namely a USB host 140 couples to fabric $120_1$ via a port E, and a USB device 145 couples to fabric $120_1$ via another port F. Understand that these different IP logics all may be designed by a single SoC designer (which may also be a manufacturer of the SoC). In other cases, one or more of the IP blocks may be a third party IP logic provided for incorporation into a given SoC. Note that in FIG. 1, each of the IP blocks and scalable fabrics has a given name. As described herein, these names may be used within configuration files and for performing channel mappings to identify particular features within the design. Understand while shown with this representative implementation for ease of discussion, embodiments apply to many different types of IC designs that incorporate one or more scalable on-chip interconnects or other interconnect structures.

Using a channel mapping component of the design tool, a user can override specific communication profiles, while leaving the remainder of channel mapping operations to the channel mapper. By using a channel mapping component of the design tool, DAC users can easily add/remove/move IP blocks and/or change a topology of the PSF network without attending to any changes to internal links of the PSF network. Instead without an embodiment, channel mapping is performed manually for an entire PSF network. Every change or delta in the overall topology would be a major design change in terms of reconfiguring channel mapping. For example, moving an IP block from one PSF segment to another will reset the entire channel mapping in at least certain PSF segments. With an embodiment, a user can modify a design to move an IP block, and the channel mapping component of the design tool may internally determine channel mapping modifications to maintain functional correctness.

Figure 2:
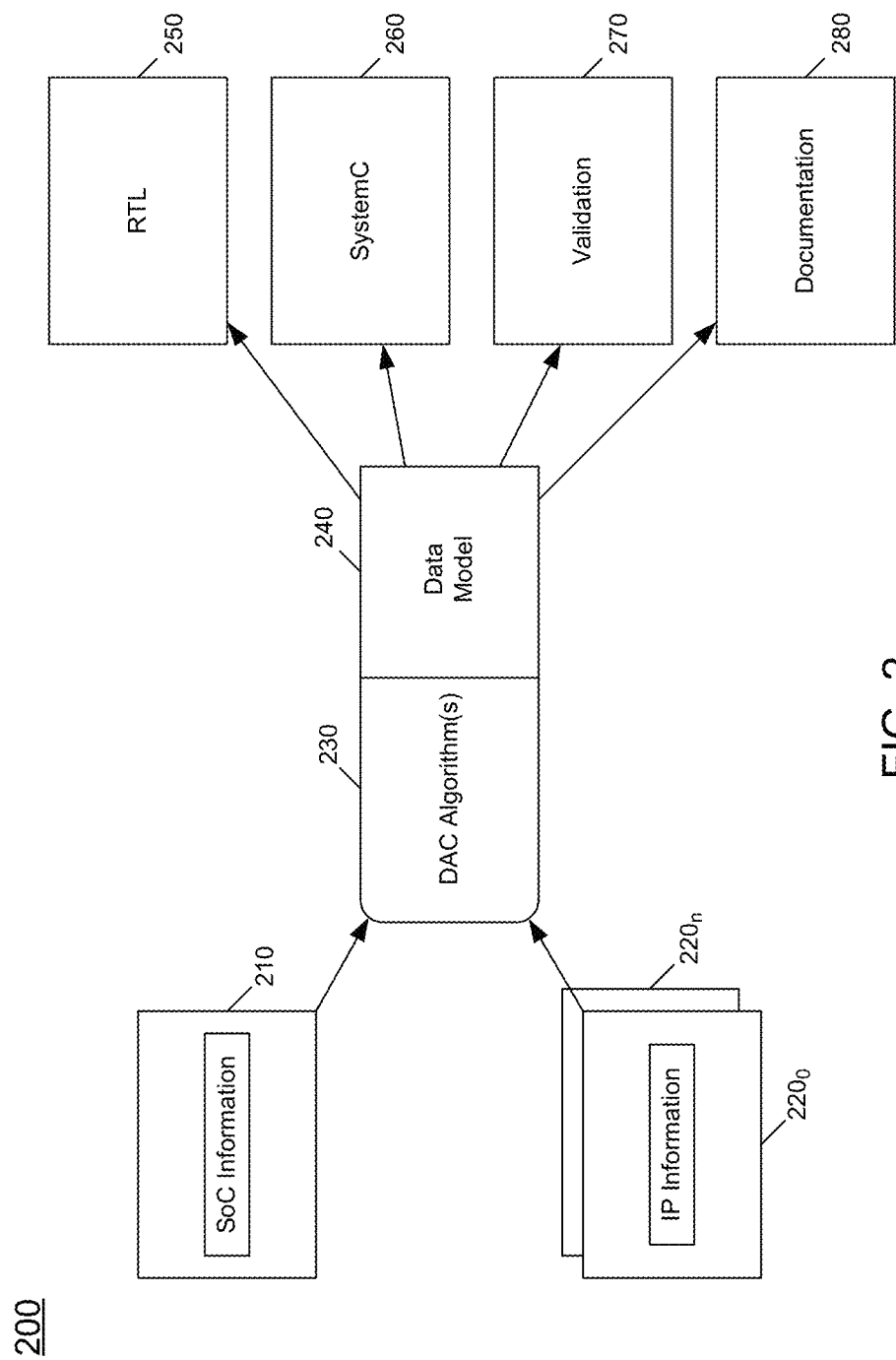
FIG. 2 is a block diagram of a design infrastructure in accordance with an embodiment.

Referring now to FIG. 2, shown is a block diagram of a design infrastructure in accordance with an embodiment. As shown in FIG. 2, design infrastructure 200, which may be implemented as a SoC design tool instantiated in one or more computer systems such as a collection of one or more server computers, provides for creation of an internal data model 240. This data model may be generated as described herein according to a range of options between a fully autonomous design and a fully user configurable design. To generate this model, a variety of different information can be used and processed by the design tool in order to form a data model, which may then be implemented in selective one or more of a wide variety of different file formats. To this end, the incoming information may include SoC information 210, which as will be described herein includes a system file, a topology file and a mapping file. In an embodiment, the system file may include information regarding a plurality of clocks available in a design. Such clock-based information may include names for the multiple clocks, frequencies, guardbands, among other such information. In an embodiment, the mapping file may include information regarding a mapping of IP meta files with the names of the corresponding IP logics. In an embodiment, the topology file may describe the requirements of the fabric. Such information may include a wide variety of features, including number of ports, buffer sizes, number of channels, mapping of channels and credit information, among large amounts of other such information. In an embodiment, this information includes topology information and end-to-end channel mapping to be used as described herein. In addition, optional information can be provided regarding a wide variety of features (e.g., buffer sizes, credit information, detailed channel mapping on each PSF, etc.). Additional incoming information includes IP information. As illustrated in FIG. 2, this IP information may take the form of a plurality of IP meta files $220_0$-$220_n$, where each such IP meta file is associated with an IP logic to be implemented within the SoC.

This information is provided to one or more DAC algorithms 230 of a set of derivation algorithms. Depending upon a desired amount of user input (ranging from every possible configurable parameter to be provided by user or zero (minimal set) of such inputs), one or more DAC algorithms 230 may operate to generate a data model 240. Note that data model 240 may be a single model that captures all parameters of a design, such as a fabric design as described herein. In embodiments, this data model may be formed in a JavaScript Object Notation (JSON) type of format. From this data model format, any of a plurality of desired types of output formats can be provided. As illustrated in FIG. 2, these output formats include an RTL configuration format 250, a SystemC model configuration file 260, a validation file 270, which may be provided in a SystemVerilog format, and a documentation file 280, which in an embodiment may be in an extended markup language (XML) or portable document format (PDF) arrangement. Understand while shown at this high level in FIG. 2, additional inputs and control mechanisms are possible.

In embodiments a system-level input of end-to-end communication requirements of an interconnect is received in the channel mapper. In an embodiment, an end-to-end communication requirement includes a tuple of (source IP, source channel, sink IP, sink channel, root space). This information informs the channel mapper that there is a traffic flow between source IP (source channel) and sink IP (sink channel). Further, the tuple also informs the channel mapper that this communication occurs in the specified root space. Additional information may also be provided. For example, the user can specify a specific channel in the PSF network over which this communication is to take place.

From this information, the channel mapper may invoke a multi-pass algorithm to map all communications to internal links of the interconnection network. In an embodiment, this channel mapping algorithm may perform the following operations: (1) create a graph model to represent the end-to-end communication requirements of the network; (2) setup and/or update internal data structures for all communication profiles where a channel mapping has been explicitly defined (e.g., by the user); (3) create/update internal data structures for all communication profiles for which a node is a Peripheral Component Interconnect Express (PCIe) device with more than one function-to-channel mapping; and (4) create/update internal data structures for any remaining communication profiles.

The channel mapper maintains this internal data structure, which is a list of objects. Each object includes the following information for a given end-to-end communication requirement: the tuple (source IP, source channel, sink IP, sink channel, root space), type of channel mapping that is desired (for example, a requirement could be to map all internal PSF channels to a specific channel), list of internal channels on each PSF segment, and traffic class associated with the channel mapping on each PSF segment. In an embodiment, the internal channels of the list are initially left empty. As the channel mapper executes its algorithms, the internal channels of each PSF segment are progressively updated. When the entire channel mapping is completed, each channel mapper object has its internal channel mapping set up for each PSF in the path from source IP to sink IP.

In effect, if the user specifies every link in all PSF segments for a given communication requirement between two IP blocks connected to the PSF, this user specification is used as-is. On the other hand, if the user does not specify all links or specifies only partial links, the channel mapper is configured to invoke the above algorithms to map the communication requirements on the necessary links.

Using an embodiment of the present invention, a user can specify the communication requirements of the interconnect in an abstracted and succinct way, while enabling an advanced user to override critical communication requirements and specify links for such requirements manually. Still further, embodiments provide a platform where different channel mapping techniques can be applied as part of a performance optimization framework. This channel mapper can thus automate the setting up of links across a network of PSF instances, without manual setup of parameters. As such, embodiments may reduce the time for configuring a PSF network, e.g., from weeks to a few hours.

As described above, an advanced user can override specific channel mappings if desired. Users can either specify entirely new links for a given end-to-end communication requirement, and/or individually specify the properties of an existing link (for example, changing a register offset of a given link). In effect, the channel mapper applies algorithms by not only satisfying constraints imposed by interconnect functional requirements, but also satisfying any user-imposed constraints. With the automation described herein, a user need not specify source and target channels for each interconnect segment, enabling great flexibility in adding/removing/moving IP blocks within a network.

Figure 3:
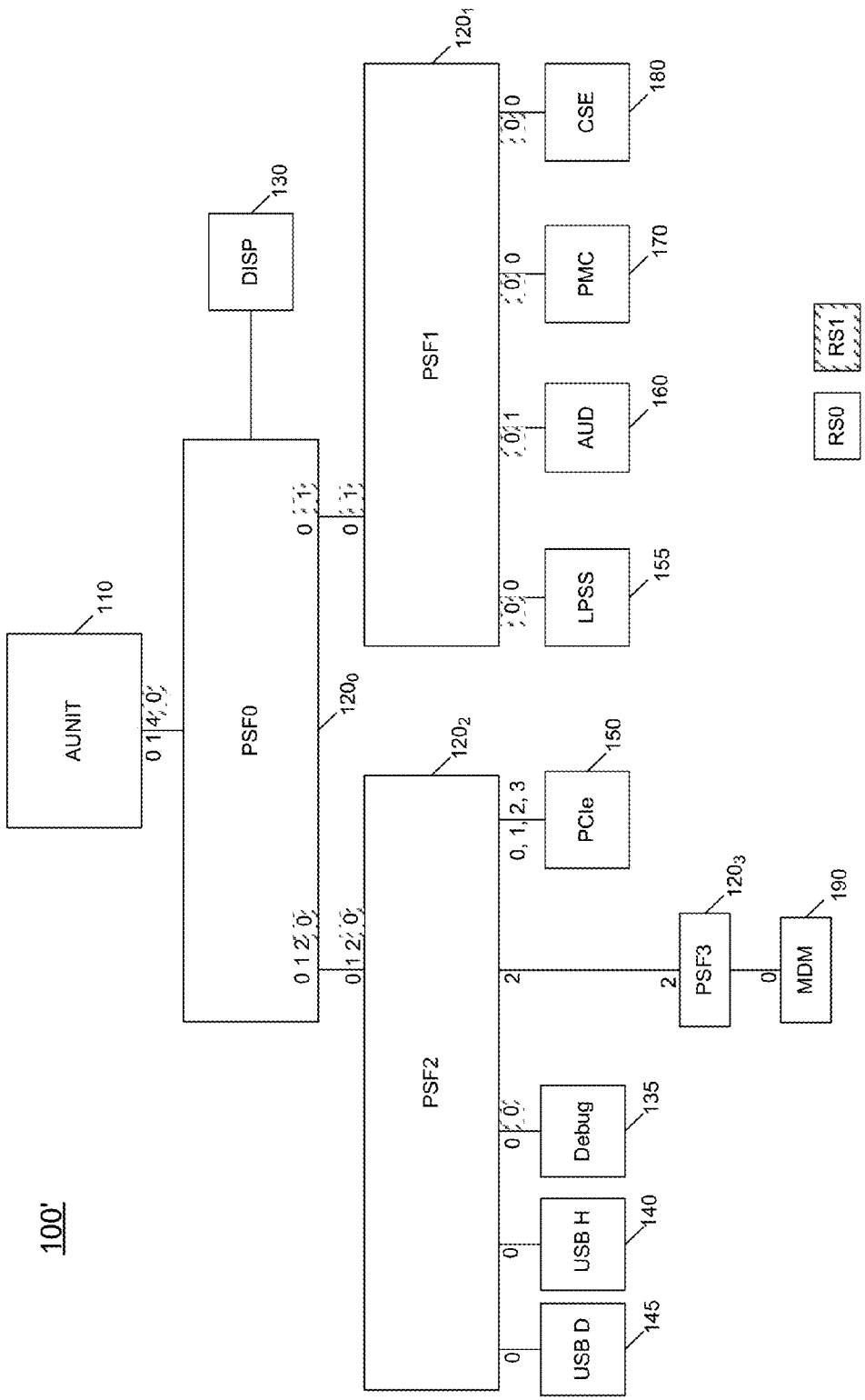
FIG. 3 is a block diagram of a network topology of a SoC in accordance with another embodiment of the present invention.

Referring now to FIG. 3, shown is a block diagram of a network topology of a SoC in accordance with another embodiment of the present invention. Specifically, SoC 100' of FIG. 3 may include many of the same components as discussed above with regard to SoC 100 of FIG. 1. More specifically, SoC 100' shows details of a PSF network including three fabric segments $120_0$-$120_2$. Fabric segment $120_0$ couples directly to AUNIT 110 and also directly to display agent 130. In addition, fabric segment $120_0$ directly couples to fabric segments $120_1$ and $120_2$. And in turn, a plurality of components directly couple to each of these fabric segments. More specifically with regard to fabric segment $120_1$, a low power subsystem agent (LPSS) 155 is directly coupled, along with an audio agent 160, a power management controller (PMC) agent 170 and a converged security engine (CSE) 180. As will be described herein, channel mapping with respect to links between each of these agents and other agents may be automatically derived by a channel mapper of a design tool such as a derivation tool as described herein, based on minimal user input provided, e.g., an end-to-end communication profile information.

Further illustrated, multiple devices directly connect to fabric segment $120_2$, including USB host 140 and USB device 145. In addition, a debug agent 135 directly couples to fabric segment $120_2$, along with a PCIe device 150. In various embodiments, PCIe device 150 may be implemented as a multi-function device. As further illustrated in FIG. 3, fabric segment $120_2$ further couples to another fabric segment $120_3$, to which a modem device 190 directly couples. Understand while shown with this representative layout in FIG. 3, it is to be understood that of course many variations and alternatives are possible.

Referring now to Table 1, shown is an example set of communication profiles requested by a user (for a topology as shown in FIG. 3).

TABLE 1

| Source | | Sink | | | |
|---|---|---|---|---|---|
| IP Name | Source Channel | IP Name | Sink Channel | Link Mapping | Root Space |
| AUNIT | 0 | PCIe | 0, 1, 2, 3 | Derived | 0 |
| AUNIT | 1 | Display, USB Device, USB Host, NPK, CSE, LPSS, AUD, PMC | 0 | Derived | 0 |
| AUNIT | 1 | AUD | 1 | Derived | 0 |
| AUNIT | 4 | Modem | 0 | ALAP: 2 | 0 |
| CSE | 0 | LPSS, NPK, AUNIT, Audio, PMC | 0 | PSF1: (0, 1) | 1 |

As illustrated in FIG. 3, a PSF network having three segments is provided, with the communication requirements described in Table 1. Here, traffic on channel 0 of AUNIT 110 is to be routed to PCIe device 150 channels 0, 1, 2 and 3. Traffic on channel 1 of AUNIT 110 is to be routed to channel 0 of the corresponding IP blocks shown in Table 1. Traffic on channel 4 of AUNIT 110 is to be routed to Modem 190 channel 0. However here, the user has specified that internally the traffic is to be mapped to channel 2. Finally, traffic on channel 0 of CSE 180 is routed to the corresponding IP block's channel 0, but the user stipulates that only on fabric segment $120_1$ (PSF1), the traffic is to pass through links from channel 0 to channel 1.

Note that the user does not care how the links are mapped for the remainder of the network. Note that FIG. 3 further illustrates the link generation process after a derivation algorithm in accordance with an embodiment is invoked. As seen, the derivation algorithm sets up links for both source-to-sink traffic and sink-to-source traffic. For example, traffic from AUNIT 110 to PCIe device 150 flows to fabric segment $120_0$ (PSF0) on channel 0, then to fabric segment $120_2$ (PSF2) on channel 0, and finally is mapped to one of the four channels (0, 1, 2, or 3) on PCIe device 150. Similarly, traffic from CSE 180 on root space 1 is internally mapped to channel 1 on fabric segment $120_1$ (PSF1) due to the specific user override, and is then mapped back to channel 0 on fabric segment $120_0$ (PSF0). Finally, traffic from AUNIT 110 to Modem 190 is mapped to channel 2 internally on fabric segment $120_2$ (PSF2) and fabric segment $120_3$ (PSF3), and finally to channel 0 on Modem 190. As used herein, the term "root space" refers to a unique set of fabric decode resources such as T0/T1 shadow registers, fixed Advanced Configuration and Power Interface (ACPI) address ranges and/or security attributes. When requesting a transaction, an agent will identify the address space in which the transaction is to provide through root space (RS) bits on a master or target command interface. For agents that do not support the RS bits, a PSF port can be compile-time configured with an AGENT_MST_ROOT SPACE, programmable over, e.g., a sideband channel. Each transaction initiated by an agent on this port can be tagged with the root space value contained in this register. The reset value of this register may be compile-time configurable.

In an embodiment, a first input to the channel mapping component of the design tool may be a PSF network topology that specifies: IP blocks and their connection to PSFs; and PSF-to-PSF connections. In turn, another input to the channel mapper is a communication requirement (traffic flow) between the IP blocks, including at minimum, a tuple of (Source IP, Source Channel, Target IP, Target Channel, Root Space). Additional information may also be specified, such as the intermediate channels in the PSF. Note that two IP blocks may communicate on one or more channels and on one or more root spaces. In some embodiments, an input with constraints optionally may be provided. For example, a constraint may be specified on how links are routed between two IP blocks or properties of a specific link, or both.

Given the above inputs, the channel mapper is configured to create links in the PSF network to ensure that traffic can be routed between two communicating IP blocks, in both directions. In addition the channel mapper is configured to ensure that all links created adhere to architectural restrictions imposed by the PSF network. As such, the channel mapper is configured to output the links and all properties of the links that enable communication among the IP blocks.

Table 2 below is a high level view of an algorithm for generating links to couple IP blocks of a SoC using a channel mapper of a design tool in accordance with an embodiment.

TABLE 2

Algorithm: Generate Links

1. Scan the input for all links that have complete end-to-end channel mapping defined:
    a. Update internal data structures.
2. Inputs = Scan the input where as late as possible (ALAP) or ALAP:N channel mapping is defined:
    a. For input in Inputs
        i. Do ALAP channel mapping (input)
        ii. Update Data Structures.
3. Inputs = Scan the input where as soon as possible (ASAP) or ASAP channel mapping is defined:
    a. For input in Inputs
        i. Do ASAP channel mapping (input)
        ii. Update Data Structures.
4. Inputs = Scan the input where target port is a PCIe device:
    a. For input in Inputs
        i. Do PCIe channel mapping (input)
        ii. Update Data Structures.
5. Inputs= For all input that have not been mapped:
    a. For input in Inputs
        i. Do source-target channel mapping (input)
        ii. Update Data Structures.

Thus as illustrated in Table 2, a user-provided input regarding high level channel profile information may be obtained and parsed by a channel mapper of a design tool in order to generate channel mapping between respective pairs of IP blocks of a SoC. While the algorithm shown in Table 2 is performed in a particular manner to select and execute different channel mapping derivation algorithms in a particular order based on user-provided requirements and/or device functionalities, understand the scope of the present invention is not limited in this regard. In other cases, the automated channel mapping described herein may be performed in different orders and in potentially different manners.

Table 3 is an example algorithm for performing as late as possible (ALAP) channel mapping in accordance with an embodiment. Generally, an ALAP channel mapping algorithm may utilize source channel information for making channel routing decisions in various intermediate fabric segments, with a final channel mapping according to sink or target channel information.

TABLE 3

Algorithm: ALAP Channel Mapping (input)

(Source, Source Channel, Sink, Sink Channel, Intermediate Channel = N) = getInputParams(input)
// When intermediate channel is not provided, default is Source Channel
Output: Map all intermediate channels to N, and map to target at the end
    1. if N == None
        a. N = Source Channel
    2. Path = Get path from Source to Sink
    3. Channels.append(Source Channel)
    4. For each port in path:
        a. If port is Sink port
            i. Channels.append(Sink Channel)
        b. Else
            i. Channels.append(N)
Output = Channels Table 4 is an example algorithm for performing as soon as possible (ASAP) channel mapping in accordance with an embodiment. Generally, an ASAP channel mapping algorithm may utilize sink channel information for making channel routing decisions in various intermediate fabric segments, with source channel mapping according to source channel information.

TABLE 4

Algorithm: ASAP Channel Mapping (input)

(Source, Source Channel, Sink, Sink Channel, Intermediate Channel = N) = getInputParams(input)
// When intermediate channel is not provided, default is Sink Channel
Output: Map all intermediate channels to N, and map to target as soon as possible
    1. if N == None
        a. N = Sink Channel
    2. Path = Get path from Source to Sink
    3. Channels.append(Source Channel)
    4. For each port in path:
        a. If port is Sink port
            i. Channels.append(Sink Channel)
        b. Else
            i. Channels.append(N)
Output = Channels Table 5 is an example algorithm for performing PCIe channel mapping in accordance with an embodiment.

TABLE 5

Algorithm: PCIe Channel Mapping (Src, Snk, SrcCh, SnkCh, trafficClass):

```
// PCIe channel mapping may implement special handling because a PCIe device may
have several functions that have function-channel dependencies.
// If the source, source channel and the corresponding traffic class are already in a
previous channel mapping setting, it may be re-used. Otherwise, if the sink, sink
channel, and traffic class are already specified in a previous channel mapping setting, that
mapping may be re-used. If no prior mapping of source or similar channel has been
done, an ALAP mapping may be performed.
      If (Src, trafficClass, SrcCh) in dictionary PCIe_D1:
            intermediate_channel = PCIe_D1(Src,TrafficClass,SrcCh)
            ChannelMap = ALAP:intermediate_channel
      else if (Snk, trafficClass, SnkCh) in dictionary PCIe_D2:
            intermediate_channel = PCIe_D2(Snk,TrafficClass,SnkCh)
            ChannelMap = ALAP:intermediate_channel
else
      ChannelMap = ALAP
```

If none of the above channel mapping algorithms is appropriate for a particular link, the channel mapper may use a source-target channel mapping algorithm to create a mapping between two IP blocks. For a given source and target (also referred to as a "sink"), the channel mapper may, for a given tuple of source and sink (source channel and sink channel), map the entire path from source to sink before moving to the next tuple. For each tuple, local decisions may be made at each PSF in the path from source to sink. For example, for a path from a generic source device (A) through three different fabric segments (PSF0, PSF1, and PSF2) and to a generic sink device (B), this algorithm attempts to find the most appropriate solution on PSF0, then the most appropriate solution at PSF1, and finally the most appropriate solution at PSF2. In determining the most appropriate solution (per PSF segment), the philosophy to be used in an embodiment is to ensure functional correctness as a first priority, and then minimize gate count when end-to-end communication indicates that channels are shared, and introduce parallel (separate channel) paths where end-to-end communication indicates that paths are parallel. For example, if the same source channel maps to the same target channel in multiple IPs, gate count may be minimized by mapping the traffic to the same channel in one or more intermediate ports, and splitting the channels at the end. However, if separate channels of an IP are mapped to some channel in multiple IPs, it indicates that there is parallel traffic flow on the channels, and the channel mapper attempts to keep the channels separate as long as possible.

Figure 4:
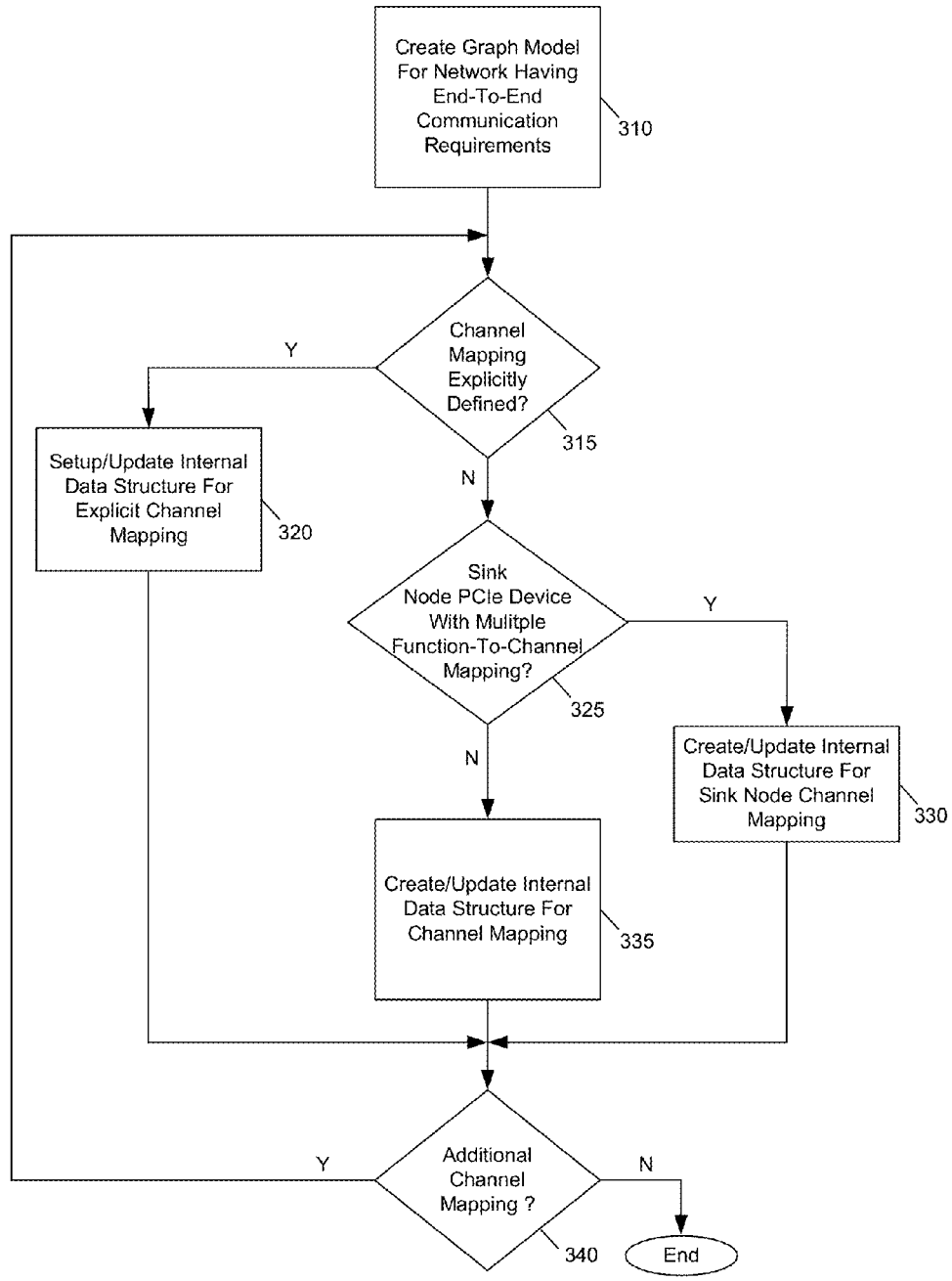
FIG. 4 is a flow diagram of a method in accordance with an embodiment of the present invention.

Referring now to FIG. 4, shown is a flow diagram of a method in accordance with an embodiment of the present invention. More specifically, method 300 is a method for operating a design tool adapted to generate a channel mapping between IP blocks through one or more primary scalable fabric segments of a SoC or other IC design. In different implementations, method 300 may be performed by hardware, software and/or firmware or combinations thereof. For example, a design tool may implement a collection of one or more software applications to execute on one or more computing systems such as one or more server computers.

As illustrated, method 300 begins by creating a graph model for a network (block 310). More specifically, the graph model may be for an on-chip network that is implemented using one or more communication fabrics or other interconnects to interconnect different IP logics or blocks of the SoC. Note that this graph model for the network accounts for end-to-end communication requirements of the network, which may be provided by a user. Note that after generation of the graph model, the remaining portions of method 300 may proceed in an iterative manner for each of a collection of communication paths or links that are to couple to different components of the SoC together, such as a given pair of IP logic blocks.

As illustrated, control passes to diamond 315 to determine whether any channel mapping for a link between two agents (e.g., source IP block and sink IP block) is explicitly defined. Note that this explicit definition from the user is one in which a complete channel mapping between source and sink is provided. If this is the case, control passes to block 320 where an internal data structure may be setup/updated for this explicit channel mapping.

Otherwise, control passes from diamond 315 to diamond 325 to determine whether the sink device is a PCIe device having multiple function-to-channel mappings. If so, control passes to block 330 where an internal data structure for the sink node channel mapping may be created/updated. Otherwise, control passes from diamond 325 to block 335 where the internal data structure for the channel mapping for this given link can be created/updated. Note from all of blocks 320, 330 and 335, control thereafter passes to diamond 340 to determine whether additional channel mappings are needed, in the case that there are additional pairs of IP logics to have channel mappings performed for them. If so, control passes back to diamond 315. Otherwise, method 300 concludes with the complete channel mapping for all IP logics of the SoC. Note that these channel mappings may be stored in a given set of configuration files. Once the channel mapping is completed, it is then used to create a register transfer level (RTL) configuration file, which in turn is used during the fabrication of the SoC.

Figure 5:
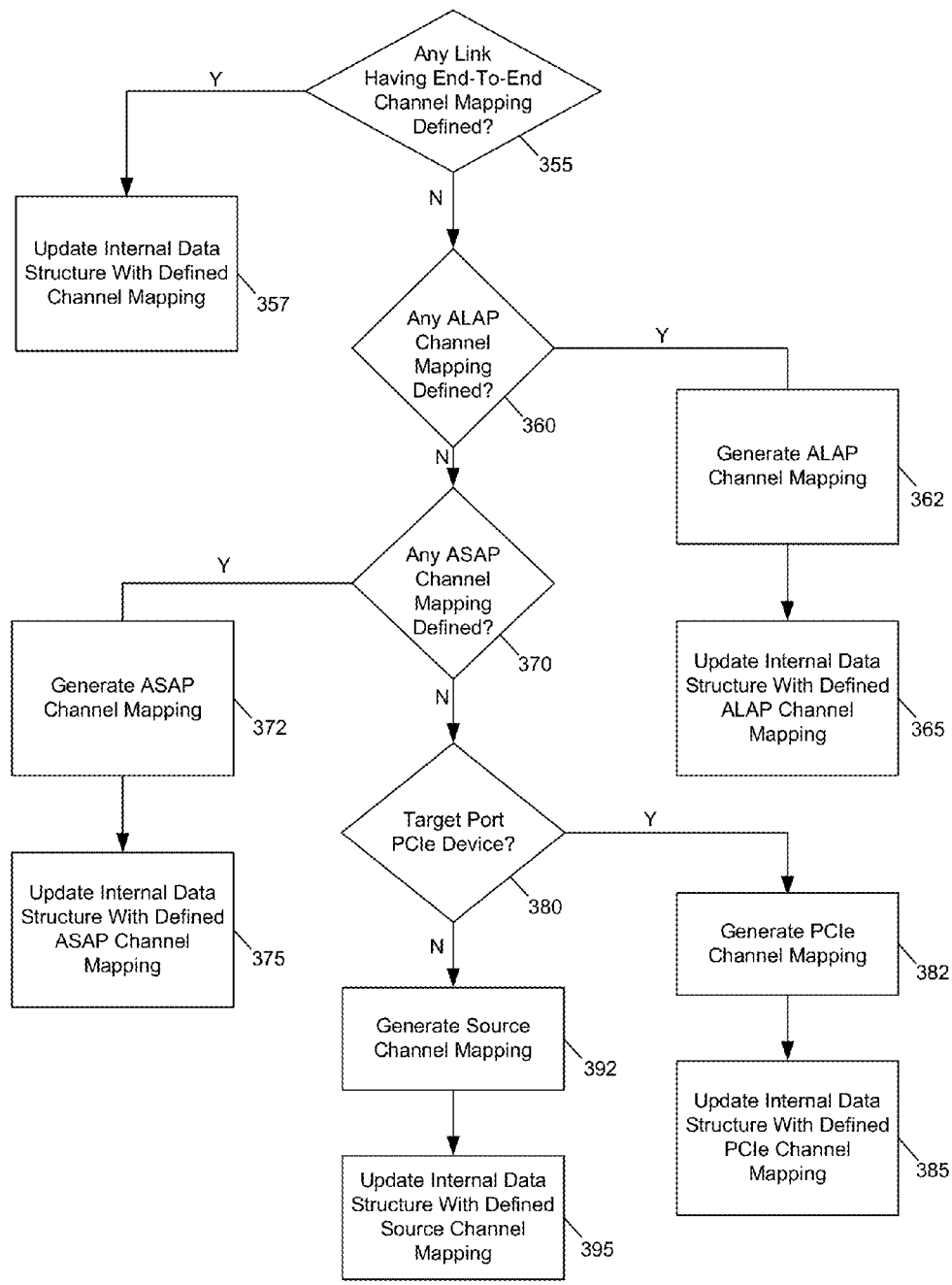
FIG. 5 is a flow diagram of a method for performing channel mapping in accordance with another embodiment of the present invention.

Referring now to FIG. 5, shown is a flow diagram of a method for performing channel mapping in accordance with another embodiment of the present invention. More specifically, method 350, which also may be performed by a channel mapper as described above, shows further details for performing channel mapping for a given SoC. As illustrated, method 350 begins by determining whether any link has a complete end-to-end channel mapping defined (diamond 355). As discussed above, this is the case where a user specifies the complete routing through channels of one or more fabric segments that couple source and destination. If so, control passes to block 357 where an internal data structure can be updated with this defined channel mapping.

Otherwise, control passes from diamond 355 to diamond 360 to determine whether any as late as possible (ALAP) channel mapping is defined. If so, control passes to block 362, where an ALAP channel mapping may be generated.

More specifically, such ALAP channel mapping may be performed as described above in Table 3, by mapping all intermediate channels on a path between source and sink with the same source channel identified in the input information and mapping the sink channel to the sink channel identified in the input information. Thereafter, control passes to block 365 where the internal data structure can be updated with this defined ALAP channel mapping.

Still with reference to FIG. 5, if there are no ALAP channel mappings defined, control next passes to diamond 370 to determine whether there are any as soon as possible (ASAP) channel mappings defined. If so, control passes to block 372, where an ASAP channel mapping may be generated. More specifically, such ASAP channel mapping may be performed as described above in Table 4, by mapping all intermediate channels on a path between source and sink with the same sink channel identified in the input information and mapping the source channel to the source channel identified in the input information. Thereafter, control passes to block 375 where the internal data structure can be updated with this defined ASAP channel mapping.

Next, if it is determined that there are no ASAP channel mappings defined, control passes to diamond 380 to determine whether any target port is of a PCIe device. If so, control passes to block 382, where a PCIe-based channel mapping may be generated, e.g., as discussed above in Table 5. Next control passes to block 385 where the internal data structure can be updated with this defined PCIe channel mapping.

Still with reference to FIG. 5, if no target port is of a PCIe device, control passes to block 392 where a source channel mapping can be generated for such link. Note that in embodiments, such source channel mapping may be performed by determining, at each PSF the most appropriate or best solution for channel mapping for that PSF to thus generate an appropriate channel mapping between source and sink. Thereafter, control passes to block 395 where an internal data structure can be updated with this defined source channel mapping. Understand while shown at this high level in the embodiment of FIG. 5, many variations and alternatives are possible.

Figure 6:
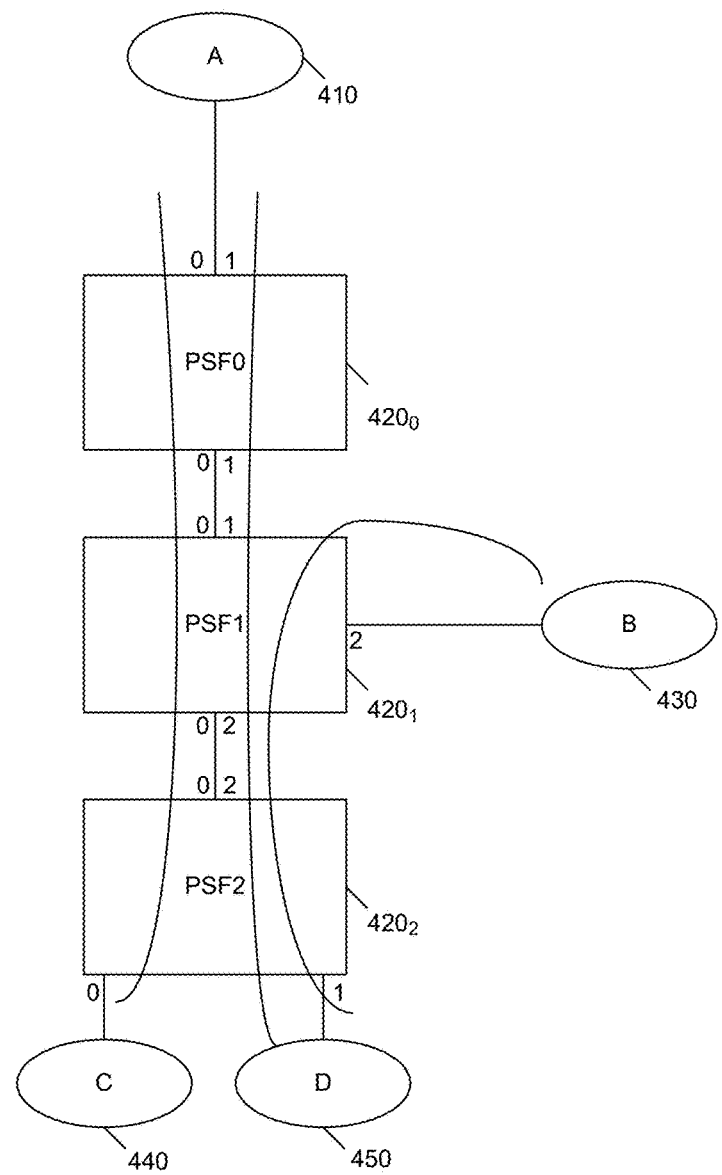
FIG. 6 is a graphical illustration of an example channel mapping determination in accordance with an embodiment.

Referring now to FIG. 6, shown is a graphical illustration of an example channel mapping determination in accordance with an embodiment. As illustrated, a SoC 400 includes multiple independent agents, such as cores, fixed hardware processing units, coprocessors, sensors or other devices. More specifically, a set of agents 410, 430, 440 and 450 are present. These agents couple through a fabric implemented as a plurality of individual fabric segments $420_0$-$420_2$. In the embodiment shown, agent 410 directly couples to fabric segment $420_0$, agent 430 directly couples to fabric segment $420_1$, while agents 440 and 450 directly couple to fabric segment $420_2$. Note that FIG. 6 further shows the channel mapping of different communication paths between pairs of these agents.

Understand that this channel mapping may be performed by a channel mapper of a design tool as described herein, e.g., based on user input. As illustrated, the path from (IP A channel 0) to (IP C channel 0) follows along channel 0 in the intermediate PSFs. The path from (IP B channel 2) to (IP D channel 1) is set up as ALAP:2, and follows along channel 2, until the last port (namely the port connecting to IP D). Finally, the path from (IP A channel 1 to IP D channel 1) starts on channel 1 on PSF0. Then on PSF1, given that channel 2 is already mapped on a path to IP D (channel 1), the channel mapper may cause this route to switch to channel 2 on PSF1, and thereafter follow along to channel 1 of IP D.

Figure 7:
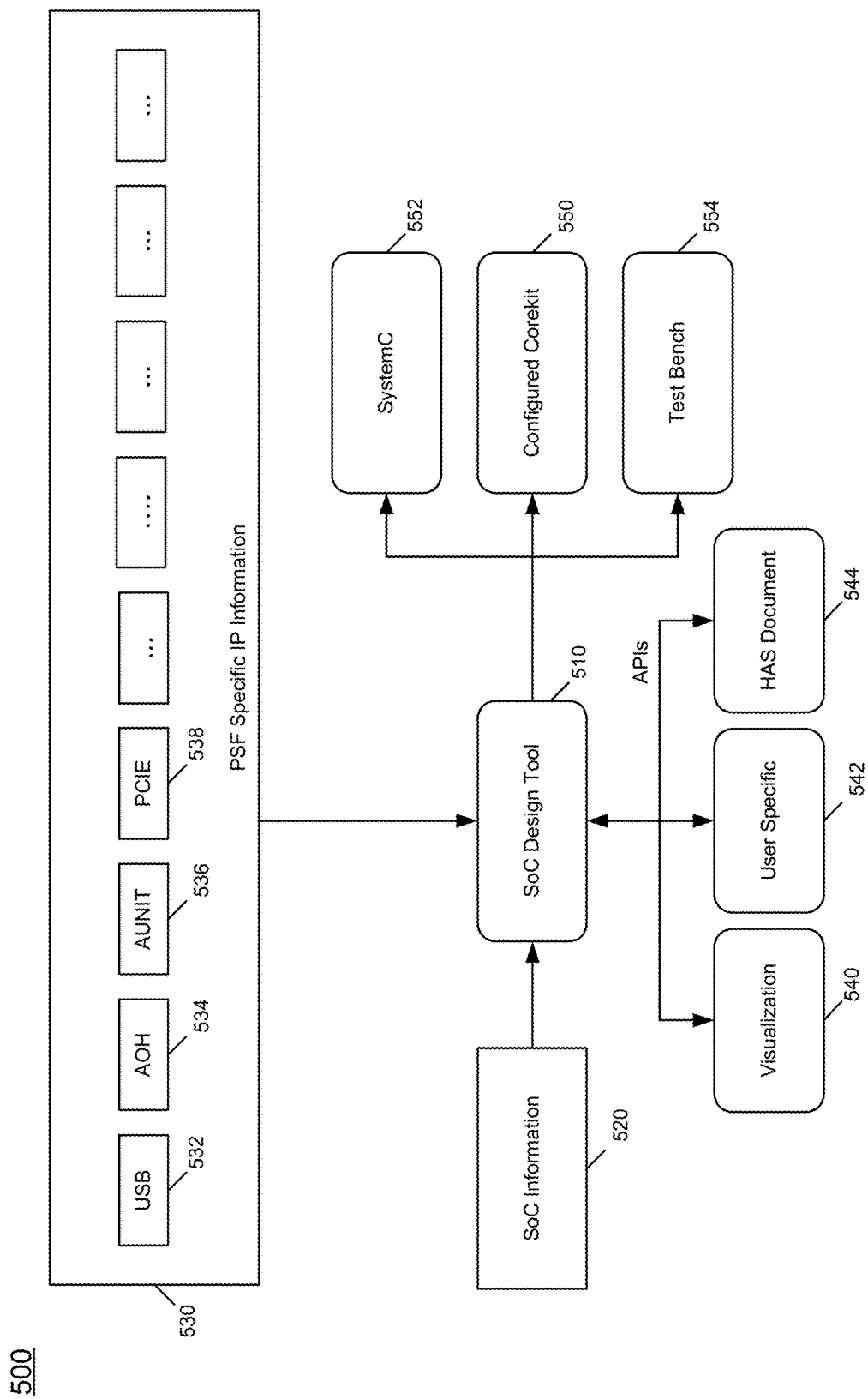
FIG. 7 is a block diagram of a design system arrangement in accordance with an embodiment.

Referring now to FIG. 7, shown is a block diagram of a design system arrangement in accordance with an embodiment. As shown in FIG. 7, system 500 is a design environment in which a SoC design tool 510 is present. As described above, such design tool 510 can be implemented as one or a number of computing systems, either located locally or coupled via remote connection. In an embodiment, SoC design tool 510 may include combinations of hardware, software and/or firmware, including a set of one or more processors (each of which may be implemented as multi-core processors), associated memories, storages, communication devices, display devices and so forth. In addition, design tool 510 may include various hardware configuration logic to perform automated configurations of all or portions of a SoC of interest. In specific embodiments described herein, such logic may include fabric configuration logic to automatically generate one or more fabrics, such as multiple primary scalable fabrics implemented on a SoC, as well as channel mapping logic to automatically generate end-to-end links between IP logics based on minimal user input, as described herein.

To this end, SoC design tool 510 is coupled to receive SoC information 520 and IP information 530. SoC information 520 may include connectivity information (e.g., including information regarding connectivity of a set of IP devices to couple to a PSF network, channel mapping for ports of the PSF (and coupled devices), among other such information). In turn, IP information 530 may include PSF-specific IP information, which may be supplied by third party vendors, in instances in which a given IP logic is provided by such third party.

As illustrated, for a particular SoC design, PSF-specific IP information may be provided for a plurality of different IP logics, including a USB device 532, an AOH 534, an AUNIT 536, and a PCIe device 538. Of course many other devices may be included in a SoC, with corresponding PSF-specific IP information provided for such devices. With an embodiment as described herein, significant responsibility may shift to IP vendors to provide IP information that may be fixed for a given SoC design. And, when a given IP meta file is provided, it may be useable for designing a wide variety of SoCs, easing design processes both for third party IP vendors and SoC manufacturers.

As further illustrated in FIG. 7, a user may interact with SoC design tool 510 via a variety of application programming interfaces (APIs), including a visualization API 540, a user-specific API 542, and an HAS document 544. Note that visualization tools, HAS documents, or other output formats such as a system Verilog-based verification tool can be written using the standard data model made visible by the DAC tool. Further, the algorithms themselves can be overridden by replacing a specific class of derivation with user defined code. The resulting outputs from SoC design tool 510 may include any of a desired number of representable formats, including a SystemC format 552, a configured core kit 550, which may be used for SoC integration, and a test bench implementation 554. Understand while shown at this high level in the embodiment of FIG. 7, many variations and alternatives are possible.

Figure 8:
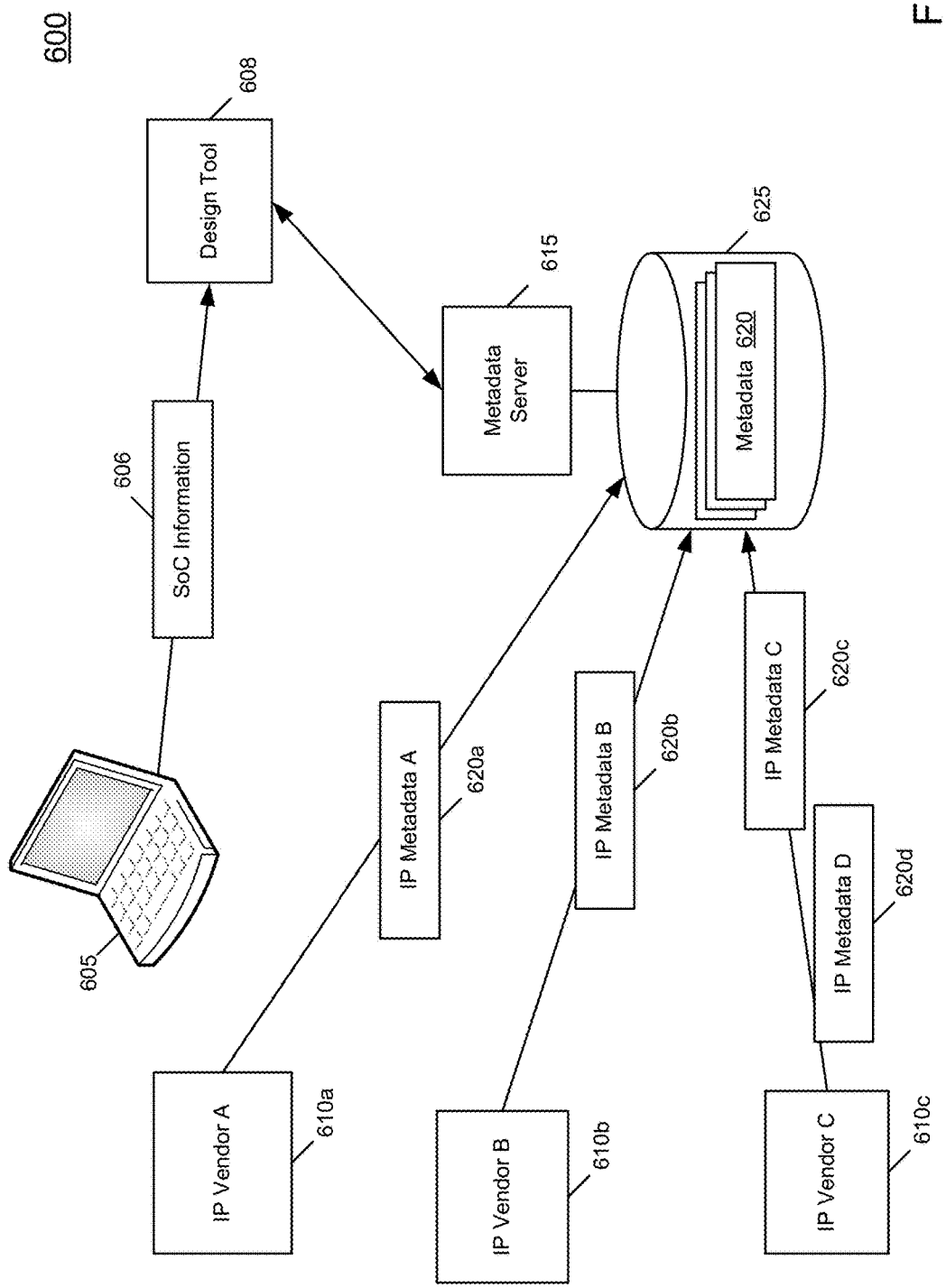
FIG. 8 is a block diagram of a system environment in accordance with an embodiment of the present invention.

Referring now to FIG. 8, shown is a block diagram of a system environment in accordance with an embodiment of the present invention. As shown in FIG. 8, system 600 may include a collection of different computing platforms coupled together in any type of network fashion. For example, some of the systems may be locally present in a given location such as a SoC vendor. In other cases, at least some of the systems may be resident at other locations, such as at enterprises of third party IP vendors that provide particular IP logics for incorporation into products of the SoC vendor. In the illustration of FIG. 8, a first system 605, which may be a server computer of the SoC designer, is used to provide SoC information 606 to a design tool 608.

As described herein, design tool 608 may be any type of computing system, such as a server computer. In addition to receipt of SoC information 606, design tool 608 further may receive IP metadata from various sources. In the illustration, these sources include a plurality of IP vendors 610a-610c which in turn may communicate corresponding IP metadata files 620a-620d. Note that at least one of the IP vendors can provide multiple IP metadata files. In embodiments, each individual IP metadata file 620 may provide configuration and other information for a particular IP logic to be incorporated into a SoC design. As illustrated, these files may be stored in a storage 625, such as a metadata storage, which may store the information to enable access by design tool 608 during configuration operations as described herein. To this end, design tool 608 may interact with a metadata server 615 that in turn couples to metadata storage 625.

As such, design tool 608, based upon the received information and user input regarding any type of overriding information to occur for particular classes of features, may generate a design abstraction of the SoC or portions thereof, including fabrics such as the PSFs described herein. Based on the received information, this design abstraction can identify details regarding the fabric and its interconnection to the IP blocks including features such as port location, port sizes, buffer sizes, virtual channels, transaction sizes, bus widths, channel mapping among other such information. Also derived are parameters that determine how multiple PSF instances inter-operate. In embodiments, channel maps on each PSF may be derived such that overall connectivity requirements are satisfied, subtractive ports are derived so that each transaction can be routed to a subtractive endpoint, and decoders at each PSF may also be derived. Understand while illustrated at this high level in the embodiment of FIG. 6, many variations and alternatives of a design environment are possible.

Figure 9:
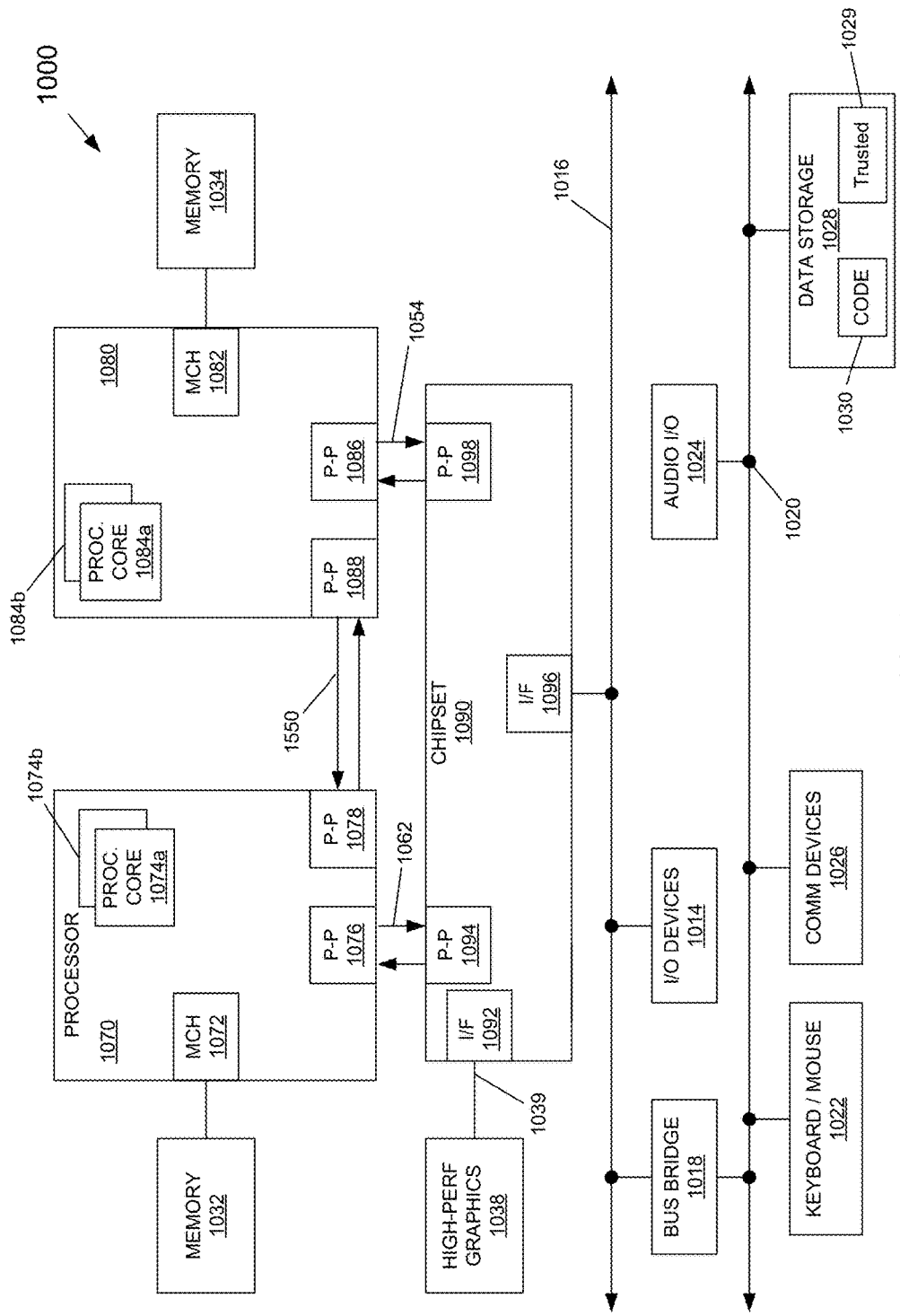
FIG. 9 is a block diagram of a design tool in accordance with another embodiment of the present invention.

Referring now to FIG. 9, shown is a block diagram of a design tool in accordance with another embodiment of the present invention. System 1000 may be configured to perform the controllable automatic, semi-automatic, and/or manual derivation of PSF parameters and channel mapping as described herein. As shown in FIG. 9, multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors.

Still referring to FIG. 9, first processor 1070 further includes a memory controller hub (MCH) 1072 and point-to-point (P-P) interfaces 1076 and 1078. Similarly, second processor 1080 includes a MCH 1082 and P-P interfaces 1086 and 1088. As shown in FIG. 9, MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. As shown in FIG. 9, chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. As shown in FIG. 9, various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030 such as derivation code for execution by the design tool, in one embodiment. As further seen, data storage unit 1028 also includes a trusted storage 1029 to store sensitive information to be protected, such as SoC information and IP metadata files. Further, an audio I/O 1024 may be coupled to second bus 1020.

Note that embodiments can be used in a multi-threaded environment for performance-based thread mapping. The complexity of mapping channels in a fabric increases by the square of the number of nodes in the fabric. To this end, by using an embodiment reliability is enhanced by enabling a derivation tool to completely derive a functionally correct channel mapping, especially as fabrics become more complex. Further, embodiments enable a user to individually control channel mapping, while at the same time overlaying the derivation algorithm under constraints imposed by the user.

As one example, an entire channel mapping of an interconnect may be derived based on end-to-end communication input. In another example, a user may partially set up link mapping of links, and enable the derivation tool to derive the remaining links. Embodiments may also perform interconnect link derivation on multiple PCIe root spaces. Still further, specific functions may be applied to support PCIe functions mapped to individual channels of the interconnect.

Using an embodiment, all links of an interconnect can be mapped to particular channels based on a top-level specification of communication characteristics. In this way, embodiments may considerably reduce the complexity of specifying channel mapping, reducing design time to configure an interconnect. By allowing a user to specify links with end-to-end connectivity (without addressing internal workings), from an architectural perspective/IP blocks and interconnect topology can be changed, without the user updating each affected link. Further, users can specify details regarding partial links that are performance critical, and let the tool derive other links.

Thus using an embodiment, design time for configuring an interconnect may be reduced. And, with a performance analysis infrastructure in accordance with an embodiment, IP blocks can be moved within a design, and all the link management occurs under the hood in a manner or transparent to the user. Nonetheless, advanced users may use a design tool in accordance with an embodiment to selectively specify certain mission critical links manually, and allow the remaining links to be derived by the tool.

The following Examples pertain to further embodiments.

In an example, a method comprises: receiving, in a design tool, communication profile information regarding a SoC undergoing a design process, the SoC to comprise a plurality of IP logics to be interconnected by a fabric including a plurality of fabric segments, the communication profile information including, at least, source channel information for a source IP logic and sink channel information for a sink IP logic; performing a channel mapping between the source IP logic and the sink IP logic through the plurality of fabric segments according to the communication profile information; and updating a data structure based on the channel mapping, to form an intermediate representation of at least a portion of the SoC.

In an example, performing the channel mapping comprises, responsive to a first link mapping request of the communication profile information, performing an as late as possible channel mapping.

In an example, the as late as possible channel mapping comprises: mapping a source port of the source IP logic to a source channel associated with the source channel information; mapping one or more intermediate channels within the plurality of fabric segments to the source channel associated with the source channel information; and mapping a sink port of the sink IP logic to a sink channel associated with the sink channel information.

In an example, performing the channel mapping comprises, responsive to a second link mapping request of the communication profile information, performing an as soon as possible channel mapping.

In an example, the as soon as possible channel mapping comprises: mapping a source port of the source IP logic to a source channel associated with the source channel information; mapping one or more intermediate channels within the plurality of fabric segments to a sink channel associated with the sink channel information; and mapping a sink port of the sink IP logic to the sink channel associated with the sink channel information.

In an example, performing the channel mapping comprises: using an end-to-end channel mapping provided by a user when the communication profile information includes the end-to-end channel mapping, the end-to-end channel mapping for a first path, and automatically performing the channel mapping for one or more other paths for which the user did not provide the end-to-end channel mapping.

In an example, when the sink IP logic comprises a PCIe device: using a first prior channel mapping if the source IP logic, a source channel associated with the source channel information and a corresponding traffic class are specified in the first prior channel mapping; using a second prior channel mapping if the sink IP logic, a sink channel associated with the sink channel information and a corresponding traffic class are specified in the second prior channel mapping; and otherwise performing a channel mapping for a link between the source IP logic and the sink IP logic using an as late as possible channel mapping.

In an example, performing the channel mapping comprises sharing at least one channel in at least one of the plurality of fabric segments for: a first path between the source IP logic and the sink IP logic; and a second path between a third IP logic and a fourth IP logic.

In an example, performing the channel mapping comprises: allocating a first channel in a first one of the plurality of fabric segments for a first path between the source IP logic and the sink IP logic; and allocating a second channel in the first one of the plurality of fabric segments for a second path between the source IP logic and a second IP logic.

In an example, the method of one or more of the above examples further comprises: enabling a user to move a location of a first IP logic from a first fabric segment of the plurality of fabric segments to a second fabric segment of the plurality of fabric segments; and automatically adjusting a channel mapping between the first IP logic and a second IP logic based at least in part on the moved location of the first IP logic.

In another example, a design tool for designing a SoC comprises: one or more processors to execute instructions; and a mapping logic to automatically generate a channel mapping for a path between a first IP logic of a SoC and a second IP logic of the SoC, the SoC to be designed by the design tool, where the mapping logic, based at least in part on user input of a source channel associated with the first IP logic, a sink channel associated with the second IP logic and at least one derivation parameter, is to generate the channel mapping according to one of a plurality of derivation algorithms.

In an example, the SoC is to comprise a plurality of IP logics to be interconnected by a fabric, the fabric including a plurality of fabric segments and the design tool is to receive SoC information regarding the SoC and a plurality of IP data files for the plurality of IP logics.

In an example, the design tool further comprises a configuration logic to create a plurality of IP data models for the plurality of IP logics and create a topology data model based at least in part on the SoC information, the topology data model including the channel mapping.

In an example, the mapping logic is, according to a first derivation algorithm of the plurality of derivation algorithms, to generate the channel mapping by mapping a first port of the first IP logic to the source channel, mapping one or more intermediate channels within the plurality of fabric segments to the source channel associated with the first IP logic, and mapping a second port of the second IP logic to the sink channel.

In an example, the mapping logic is, according to a second derivation algorithm of the plurality of derivation algorithms, to generate the channel mapping by mapping a first port of the first IP logic to the source channel, mapping one or more intermediate channels within the plurality of fabric segments to the sink channel associated with the second IP logic, and mapping a second port of the second IP logic to the sink channel.

In an example, the mapping logic is, according to a third derivation algorithm of the plurality of derivation algorithms, to generate the channel mapping by using an end-to-end channel mapping provided in the user input.

In an example, the mapping logic is, according to a fourth derivation algorithm of the plurality of derivation algorithms, to generate the channel mapping by using one of: a first prior channel mapping if the first IP logic, the source channel and a corresponding traffic class are specified in the first prior channel mapping; and a second prior channel mapping if the second IP logic, the sink channel and a corresponding traffic class are specified in the second prior channel mapping.

In another example, a method for designing a SoC comprises: receiving, in a computing system, communication profile information regarding a SoC undergoing a design process, the SoC to comprise a plurality of IP logics to be interconnected by a fabric including a plurality of fabric segments, the communication profile information including, at least, source channel information for a source IP logic and sink channel information for a sink IP logic; automatically performing, in the computing system, a channel mapping between the source IP logic and the sink IP logic through the plurality of fabric segments according to the communication profile information, without receiving intermediate channel information associated with one or more intermediate fabric segments of the plurality of fabric segments, the intermediate fabric segments coupled between the source IP logic and the sink IP logic; and updating a data structure based on the channel mapping.

In an example, the method further comprises: receiving, in the computing system, an indication of a design change comprising movement of a location of a first IP logic of the plurality of IP logics from a first fabric segment of the plurality of fabric segments to a second fabric segment of the plurality of fabric segments; and automatically adjusting a channel mapping between the first IP logic and a second IP logic based at least in part on the moved location of the first IP logic.

In an example, the method further comprises: selecting one of a plurality of derivation algorithms based at least in part on the communication profile information; and automatically performing the channel mapping between the source IP logic and the sink IP logic according to the selected one of the plurality of derivation algorithms.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In yet another example, an apparatus for designing a SoC comprises: means for receiving communication profile information regarding a SoC undergoing a design process, the SoC to comprise a plurality of IP logics to be interconnected by a fabric including a plurality of fabric segments, the communication profile information including, at least, source channel information for a source IP logic and sink channel information for a sink IP logic; means for performing a channel mapping between the source IP logic and the sink IP logic through the plurality of fabric segments according to the communication profile information, without receiving intermediate channel information associated with one or more intermediate fabric segments of the plurality of fabric segments, the intermediate fabric segments coupled between the source IP logic and the sink IP logic; and means for updating a data structure based on the channel mapping.

In an example, the apparatus further comprises: means for receiving an indication of a design change comprising movement of a location of a first IP logic of the plurality of IP logics from a first fabric segment of the plurality of fabric segments to a second fabric segment of the plurality of fabric segments; and means for automatically adjusting a channel mapping between the first IP logic and a second IP logic based at least in part on the moved location of the first IP logic.

In an example, the apparatus further comprises: means for selecting one of a plurality of derivation algorithms based at least in part on the communication profile information; and means for performing the channel mapping between the source IP logic and the sink IP logic according to the selected one of the plurality of derivation algorithms.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A non-transitory machine-readable medium having stored thereon instructions, which if performed by a design tool cause the design tool to perform a method comprising:
receiving, in the design tool, communication profile information regarding a system on chip (SoC) undergoing a design process, the SoC to comprise a plurality of intellectual property (IP) logics to be interconnected by a fabric including a plurality of fabric segments, the communication profile information including, at least, source channel information for a source IP logic and sink channel information for a sink IP logic;
performing a channel mapping between the source IP logic and the sink IP logic through the plurality of fabric segments according to the communication profile information;
updating a data structure based on the channel mapping, to form an intermediate representation of at least a portion of the SoC; and
creating a configuration file using the data structure, and fabricating the SoC using the configuration file.

2. The non-transitory machine-readable medium of claim 1, wherein performing the channel mapping comprises, responsive to a first link mapping request of the communication profile information, performing an as late as possible channel mapping.

3. The non-transitory machine-readable medium of claim 2, wherein the as late as possible channel mapping comprises:

mapping a source port of the source IP logic to a source channel associated with the source channel information;

mapping one or more intermediate channels within the plurality of fabric segments to a source channel associated with the source channel information; and mapping a sink port of the sink IP logic to a sink channel associated with the sink channel information.

4. The non-transitory machine-readable medium of claim 1, wherein performing the channel mapping comprises, responsive to a second link mapping request of the communication profile information, performing an as soon as possible channel mapping.

5. The non-transitory machine-readable medium of claim 4, wherein the as soon as possible channel mapping comprises:

mapping a source port of the source IP logic to a source channel associated with the source channel information;

mapping one or more intermediate channels within the plurality of fabric segments to a sink channel associated with the sink channel information; and mapping a sink port of the sink IP logic to the sink channel associated with the sink channel information.

6. The non-transitory machine-readable medium of claim 1, wherein performing the channel mapping comprises:

using an end-to-end channel mapping provided by a user when the communication profile information includes the end-to-end channel mapping, the end-to-end channel mapping for a first path, and automatically performing the channel mapping for one or more other paths for which the user did not provide the end-to-end channel mapping.

7. The non-transitory machine-readable medium of claim 1, wherein when the sink IP logic comprises a peripheral component interconnect express (PCIe) device:

using a first prior channel mapping if the source IP logic, a source channel associated with the source channel information and a corresponding traffic class are specified in the first prior channel mapping;

using a second prior channel mapping if the sink IP logic, a sink channel associated with the sink channel information and a corresponding traffic class are specified in the second prior channel mapping; and otherwise performing a channel mapping for a link between the source IP logic and the sink IP logic using an as late as possible channel mapping.

8. The non-transitory machine-readable medium of claim 1, wherein performing the channel mapping comprises sharing at least one channel in at least one of the plurality of fabric segments for:

a first path between the source IP logic and the sink IP logic; and a second path between a third IP logic and a fourth IP logic.

9. The non-transitory machine-readable medium of claim 1, wherein performing the channel mapping comprises:

allocating a first channel in a first one of the plurality of fabric segments for a first path between the source IP logic and the sink IP logic; and allocating a second channel in the first one of the plurality of fabric segments for a second path between the source IP logic and a second IP logic.

10. The non-transitory machine-readable medium of claim 1, wherein the method further comprises:

enabling a user to move a location of a first IP logic from a first fabric segment of the plurality of fabric segments to a second fabric segment of the plurality of fabric segments; and automatically adjusting a channel mapping between the first IP logic and a second IP logic based at least in part on the moved location of the first IP logic.

11. A method comprising:

receiving, in a design tool, communication profile information regarding a system on chip (SoC) undergoing a design process, the SoC to comprise a plurality of intellectual property (IP) logics to be interconnected by a fabric including a plurality of fabric segments, the communication profile information including, at least, source channel information for a source IP logic and sink channel information for a sink IP logic;

performing a channel mapping between the source IP logic and the sink IP logic through the plurality of fabric segments according to the communication profile information;

updating a data structure based on the channel mapping, to form an intermediate representation of at least a portion of the SoC; and creating a configuration file using the data structure, and fabricating the SoC using the configuration file.

12. The method of claim 11, wherein performing the channel mapping comprises, responsive to a first link mapping request of the communication profile information, performing an as late as possible channel mapping.

13. The method of claim 12, wherein the as late as possible channel mapping comprises:

mapping a source port of the source IP logic to a source channel associated with the source channel information;

mapping one or more intermediate channels within the plurality of fabric segments to a source channel associated with the source channel information; and mapping a sink port of the sink IP logic to a sink channel associated with the sink channel information.

14. The method of claim 11, wherein performing the channel mapping comprises, responsive to a second link mapping request of the communication profile information, performing an as soon as possible channel mapping.

15. The method of claim 14, wherein the as soon as possible channel mapping comprises:

mapping a source port of the source IP logic to a source channel associated with the source channel information;

mapping one or more intermediate channels within the plurality of fabric segments to a sink channel associated with the sink channel information; and mapping a sink port of the sink IP logic to the sink channel associated with the sink channel information.

16. The method of claim 11, wherein performing the channel mapping comprises:

using an end-to-end channel mapping provided by a user when the communication profile information includes the end-to-end channel mapping, the end-to-end channel mapping for a first path, and automatically performing the channel mapping for one or more other paths for which the user did not provide the end-to-end channel mapping.

17. The method of claim 11, wherein when the sink IP logic comprises a peripheral component interconnect express (PCIe) device, the method further comprises:

using a first prior channel mapping if the source IP logic, a source channel associated with the source channel information and a corresponding traffic class are specified in the first prior channel mapping;

using a second prior channel mapping if the sink IP logic, a sink channel associated with the sink channel information and a corresponding traffic class are specified in the second prior channel mapping; and otherwise performing a channel mapping for a link between the source IP logic and the sink IP logic using an as late as possible channel mapping.

18. The method of claim 11, wherein performing the channel mapping comprises sharing at least one channel in at least one of the plurality of fabric segments for:

a first path between the source IP logic and the sink IP logic; and a second path between a third IP logic and a fourth IP logic.

19. The method of claim 11, wherein performing the channel mapping comprises:

allocating a first channel in a first one of the plurality of fabric segments for a first path between the source IP logic and the sink IP logic; and allocating a second channel in the first one of the plurality of fabric segments for a second path between the source IP logic and a second IP logic.

20. The method of claim 11, wherein the method further comprises:

enabling a user to move a location of a first IP logic from a first fabric segment of the plurality of fabric segments to a second fabric segment of the plurality of fabric segments; and automatically adjusting a channel mapping between the first IP logic and a second IP logic based at least in part on the moved location of the first IP logic.

* * * * *